United States Patent [19]
Zheng

[11] Patent Number: 6,094,378
[45] Date of Patent: *Jul. 25, 2000

[54] SYSTEM FOR IMPROVED MEMORY CELL ACCESS

[75] Inventor: Hua Zheng, Boise, Id.

[73] Assignee: Micron Technology, Inc., Boise, Id.

[*] Notice: This patent is subject to a terminal disclaimer.

[21] Appl. No.: 09/348,794

[22] Filed: Jul. 7, 1999

Related U.S. Application Data

[63] Continuation of application No. 08/999,865, Apr. 18, 1997, Pat. No. 5,959,933, which is a continuation of application No. 08/591,758, Jan. 25, 1996, abandoned.

[51] Int. Cl.[7] .................................................. G11C 7/00
[52] U.S. Cl. .......................... 365/189.11; 365/230.06; 365/189.09
[58] Field of Search ........................ 365/189.11, 230.06, 365/189.09, 189.01, 230.01

[56] References Cited

U.S. PATENT DOCUMENTS

| 4,751,679 | 6/1988 | Dehganpour | 365/201 |
| 5,128,560 | 7/1992 | Chern et al. | 307/475 |
| 5,128,563 | 7/1992 | Hush et al. | 307/482 |
| 5,202,587 | 4/1993 | McLaury | 307/296.2 |
| 5,245,569 | 9/1993 | Gonzalez et al. | 365/104 |
| 5,268,600 | 12/1993 | Yeu | 307/482 |
| 5,285,408 | 2/1994 | Starkweather et al. | 365/189 |
| 5,329,186 | 7/1994 | Hush et al. | 307/482 |
| 5,341,329 | 8/1994 | Takebuchi | 365/185 |
| 5,349,247 | 9/1994 | Hush et al. | 307/451 |
| 5,357,172 | 10/1994 | Lee et al. | 315/167 |
| 5,367,205 | 11/1994 | Powell | 326/27 |
| 5,369,317 | 11/1994 | Casper et al. | 326/87 |
| 5,369,320 | 11/1994 | Satani et al. | 327/108 |
| 5,390,143 | 2/1995 | Manning | 365/145 |
| 5,420,822 | 5/1995 | Kato et al. | 365/218 |
| 5,455,801 | 10/1995 | Blodgett et al. | 365/222 |
| 5,512,845 | 4/1996 | Yuh | 326/88 |
| 5,515,327 | 5/1996 | Matsukawa et al. | 365/203 |
| 5,959,933 | 9/1999 | Zeng | 365/230.06 |

Primary Examiner—David Nelms
Assistant Examiner—Hoai V. Ho
Attorney, Agent, or Firm—Schwegman, Lundberg, Woessner & Kluth, P.A.

[57] ABSTRACT

A voltage booting circuit for booting the switching signal applied to a column access passgate is employed to reduce the voltage drop across the passgate. Reduction of the voltage dropped across the passgate results in faster read and write times and improved noise margin. In one application the booted voltage is used only during a write operation, but not during a read. In another application, the booted voltage is used during both operations.

16 Claims, 4 Drawing Sheets

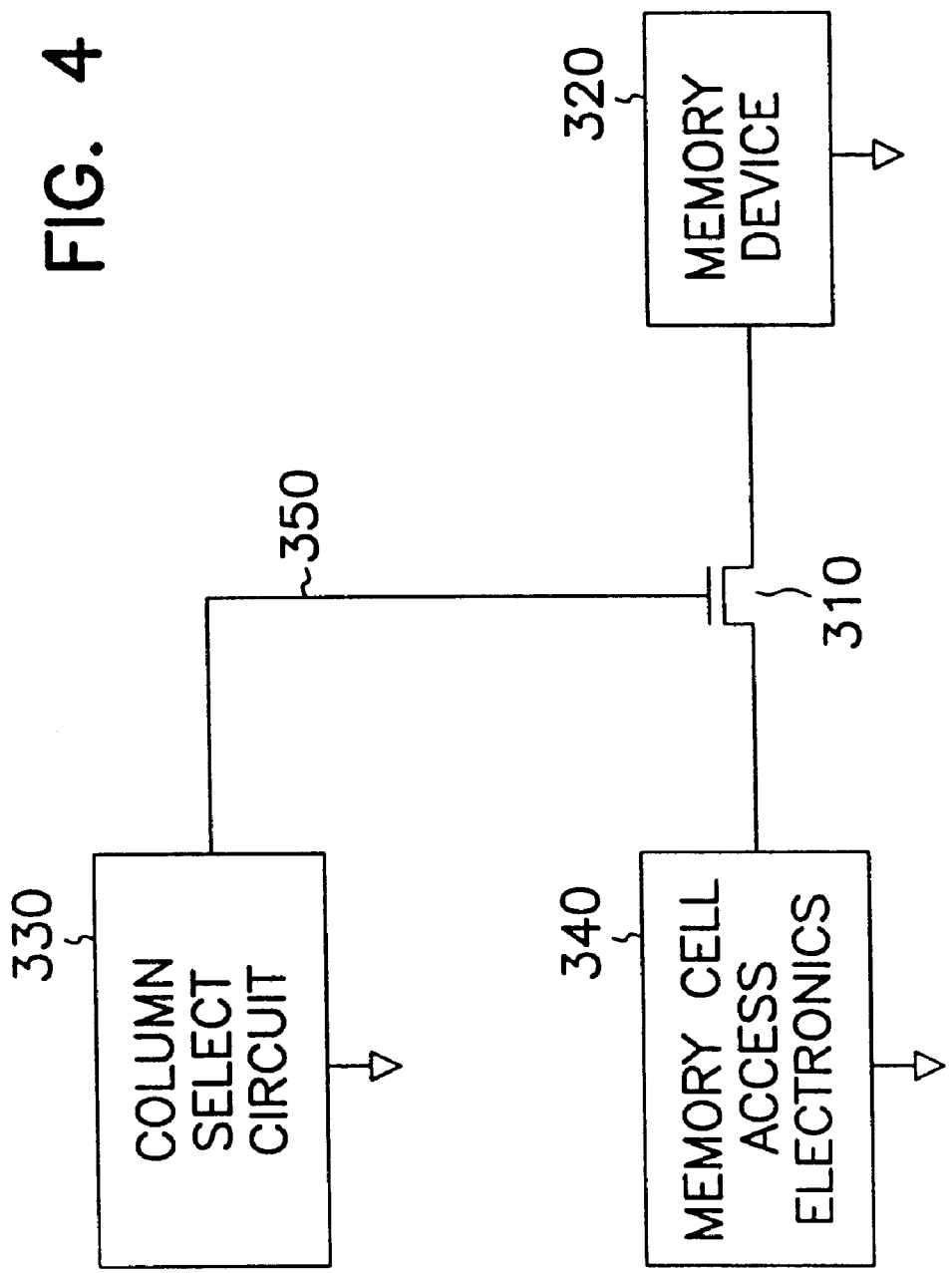

SYSTEM FOR IMPROVED MEMORY CELL ACCESS

This application is a Continuation of U.S. Ser. No. 08/999,865, U.S. Pat. No. 5,959,933, filed Apr. 18, 1997, which was a file wrapper continuation of U.S. Ser. No. 08/591,758, filed Jan. 25, 1996, and now abandoned.

FIELD OF THE INVENTION

The present invention relates generally to a system for improved memory cell access, and in particular to a booted column access system for rapid memory cell read and write.

BACKGROUND OF THE INVENTION

Improvements in memory device applications result in larger cell arrays and faster memory access requirements. For example, dynamic random access memories (DRAMs) use an array of memory cells, sense amplifiers, drivers and support electronics to manage data read, data write and cell refresh operations. The memory cells are generally miniature capacitors which vary in stored charge according to the voltage written to the cell. Since each memory cell has leakage losses, each cell must be refreshed periodically to prevent loss of the information in each cell. This is called a "writeback" operation and is performed by periodically reading each cell and refreshing the cell by internally writing a logic one to the cells storing a one. Additionally, each cell is rewritten upon a read instruction, since the reads are destructive without the immediate rewrite.

Static memories (SRAMs) include an array of active memory cells which maintain a programmed logic state without the need for refresh. Increasingly larger memory cell arrays add to the latency of cell read and write operations.

Therefore, there is a need in the art for a system for faster memory cell access and refresh. The system should be implemented with the fewest number of modifications to avoid complications to the chip topology and increased power dissipation.

SUMMARY OF THE INVENTION

The present disclosure describes a memory access system for improved memory cell read and write. The present disclosure describes in detail a limited number of environments in which the present invention may be practiced, however, other applications and environments exist in which the present invention may be practiced.

One environment in which present memory technology may be used is DRAM circuits. In DRAM architectures, a single write driver and I/O sense amplifier are generally shared among a number of columns in a memory array. The sharing is performed by multiplexing the memory array columns using a number of passgates which programmably interconnect a pair of digit lines to the write driver and I/O sense amplifier. Each passgate isolates the digit lines from the write driver and I/O sense amplifier and each is controlled by a column select signal during a read or write operation to a selected memory cell.

In one embodiment of the present memory access system, a voltage booster is used to increase the column select signal voltage applied to the passgate to avoid a voltage drop across the passgate during memory cell read and write operations.

In an alternate embodiment, the voltage booster is limited to only specific memory cell operations. For example, the voltage booster is applied only during a write operation, but not during the read operation.

Other applications and embodiments are described, such as a static memory application, other circuit embodiments, and the use of different boost voltages, however, these examples are for illustrating the present memory access system, and are not intended in an exclusive or limiting sense.

BRIEF DESCRIPTION OF THE DRAWINGS

In the drawings, where like numerals describe like components throughout the several views:

FIG. 4 is a block diagram of one embodiment of the present memory access system.

DETAILED DESCRIPTION OF THE PREFERRED EMBODIMENT

In the following detailed description of the preferred embodiment, references are made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural changes may be made without departing from the spirit and scope of the present invention. The following detailed description is, therefore, not to be taken in a limiting sense, and the scope of the present invention is defined by the appended claims and equivalents thereof.

Figure 1:
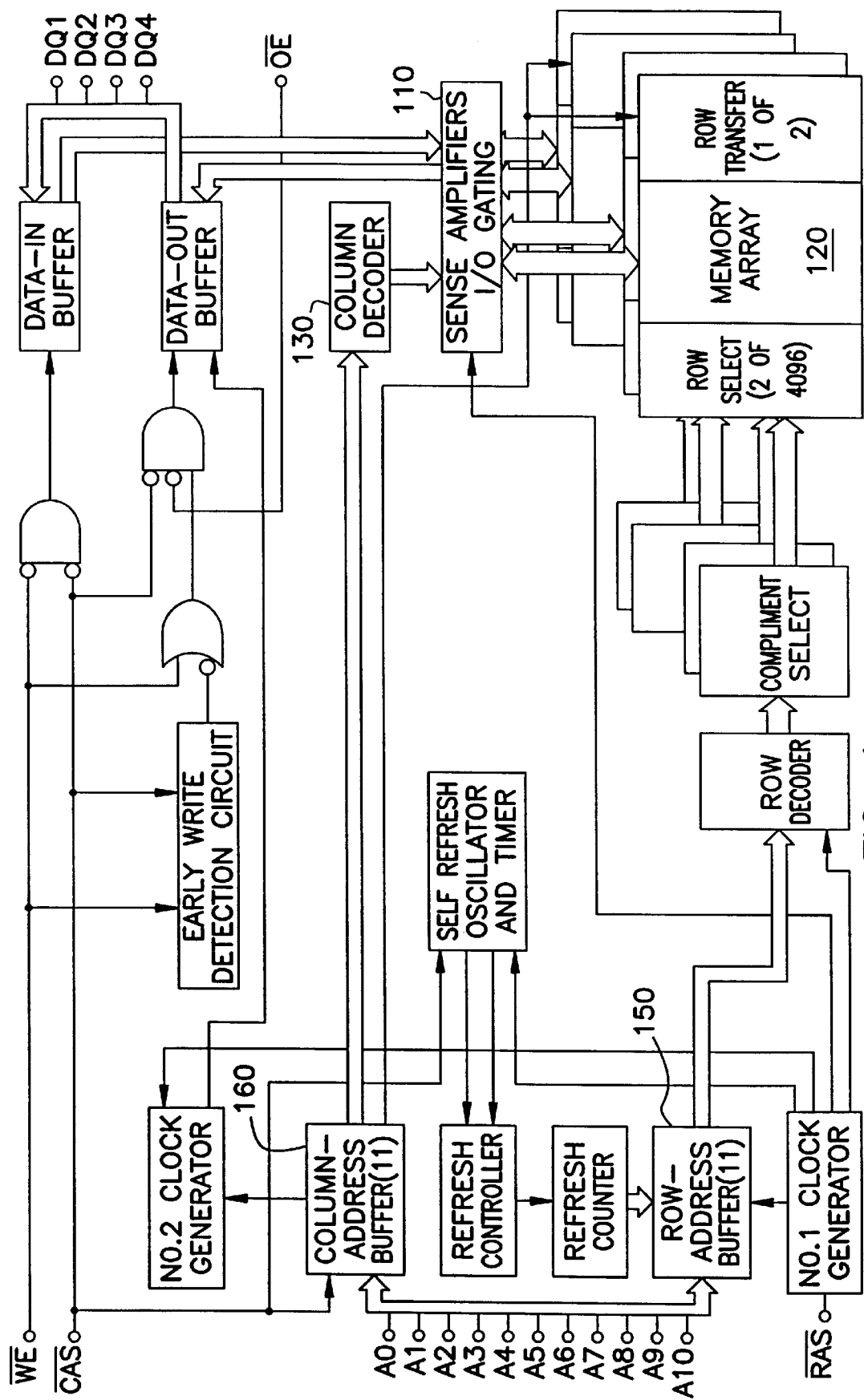
FIG. 1 is a functional block diagram of a DRAM circuit.

FIG. 1 is a functional block diagram of a Dynamic Random Access Memory (DRAM), which is one environment in which the present memory access system may be practiced. Those skilled in the art will readily recognize that other applications of the present memory access system are possible and that the description of the present invention in this embodiment is for demonstrating the present memory access system, and is not intended in a limiting or exclusive sense. For the purposes of this disclosure, the term "access" refers to any operation with a memory cell, including, but not limited to, reading from and writing to a memory cell.

The memory shown in the functional block diagram of FIG. 1 operates according to well known principals. The eleven address lines shown to the left of FIG. 1 are clocked into the row address buffer 150 by the signal RAS (row address strobe) to select the row in the memory array to be read or written. At a later time, the same eleven address lines are clocked into the column address buffer 160 by the signal CAS (column address strobe) to select the column in the memory array to be read or written. The data lines shown in the right of FIG. 1 are bidirectional data ports used for both reading and writing data.

Figure 2:
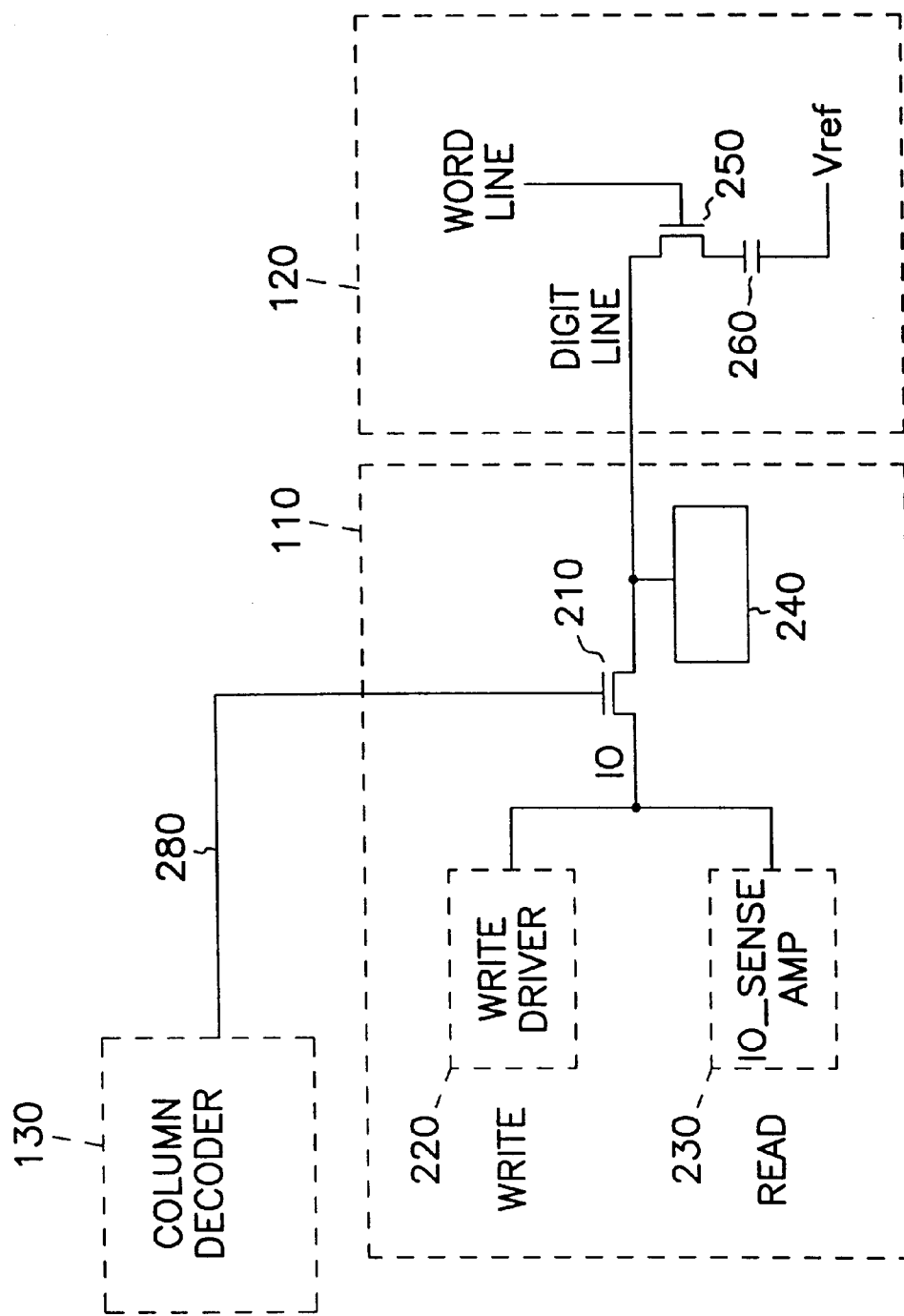
FIG. 2 is a block diagram of a portion of a DRAM circuit showing the operation of the passgate in isolating the digit line from the write driver and I/O sense amplifier.

FIG. 2 shows a block diagram featuring some of the details of the sense amplifiers and I/O gating 110 block, the memory array 120 block and the column decoder 130 block. The sense amplifiers and I/O gating 110 include a number of write drivers 220, I/O sense amplifiers 230, passgates 210 and sense amplifiers 240. In FIG. 2 only a single write driver 220, I/O sense amplifier 230, passgate 210 and sense amplifier 240 are shown to demonstrate the operation of the circuit. Additionally, present memory cell circuits are differential in nature, however, the circuit in FIG. 2 was simplified to a single ended circuit for purposes of demonstration. Furthermore, the memory array 120 as shown in FIG. 2 depicts only a single memory cell 260 and access device 250 of a plurality of memory cells for the purposes of illustrating the operation of the circuit.

Column decoder 130 generates a column select signal 280 to enable passgate 210 to pass signals between the access device 250 and the write driver 220 and I/O sense amplifier 230.

In a write operation to memory cell 260, passgate 210 is activated and memory cell 260 is written by write driver 220. After the memory cell 260 is written, the column select signal 280 is switched to deactivate passgate 210 and isolate the write driver 220 from the access device 250, allowing write driver 220 to write to a different cell.

In a read operation, passgate 210 is activated and I/O sense amplifier 230 receives the output of memory cell 260 as sensed and conditioned by sense amplifier 240. After the signal is received and I/O sense amplifier 230 is activated, the column select signal 280 is switched to deactivate passgate 210 and isolate the I/O sense amplifier 230 from the access device 250 and memory cell 260.

In a DRAM device, selection of the charge storage capacity of the memory cells is driven by a number of factors, including the amount of capacitance of the digit lines and the refresh rate of the device. The memory cell capacitance is a factor in the access time of each memory cell, since each memory cell is charged by a voltage approximately equal to the chip supply voltage through a resistance. The resistance-capacitance product provides the time constant of the typical cell charging time, however, there are additional limitations in cell access times, such as charging of the digit lines and sense amplifier setup times.

Assuming a fixed memory cell capacitance, the resistive portion of the memory cell charging circuit is the passgate 210 resistance in series with the internal resistance of the write driver 220, as shown in FIG. 2. In most DRAM chip designs, time allocated for charging each memory cell is kept to a minimum to provide rapid access to the memory array and to minimize the time reserved for maintenance of the memory array, such as cell refresh operations.

If the column select signal 280 has a voltage magnitude of approximately the chip supply voltage, Vcc, then the passgate 210 will not pass the entire write voltage produced by write driver 220 during a write operation. The resulting logic one voltage passed will be approximately the chip supply voltage, Vcc, minus the threshold voltage, Vt, of the passgate 210. The loss of the logic one voltage magnitude slows the WRITE/READ speed of the DRAM and decreases DRAM performance. If the logic one voltage were a full Vcc value, then the charging of the memory cell during a write operation would be faster, due to a larger potential across the memory cell, and ohmic dissipation across the passgate 210 would be minimized.

Figure 3:
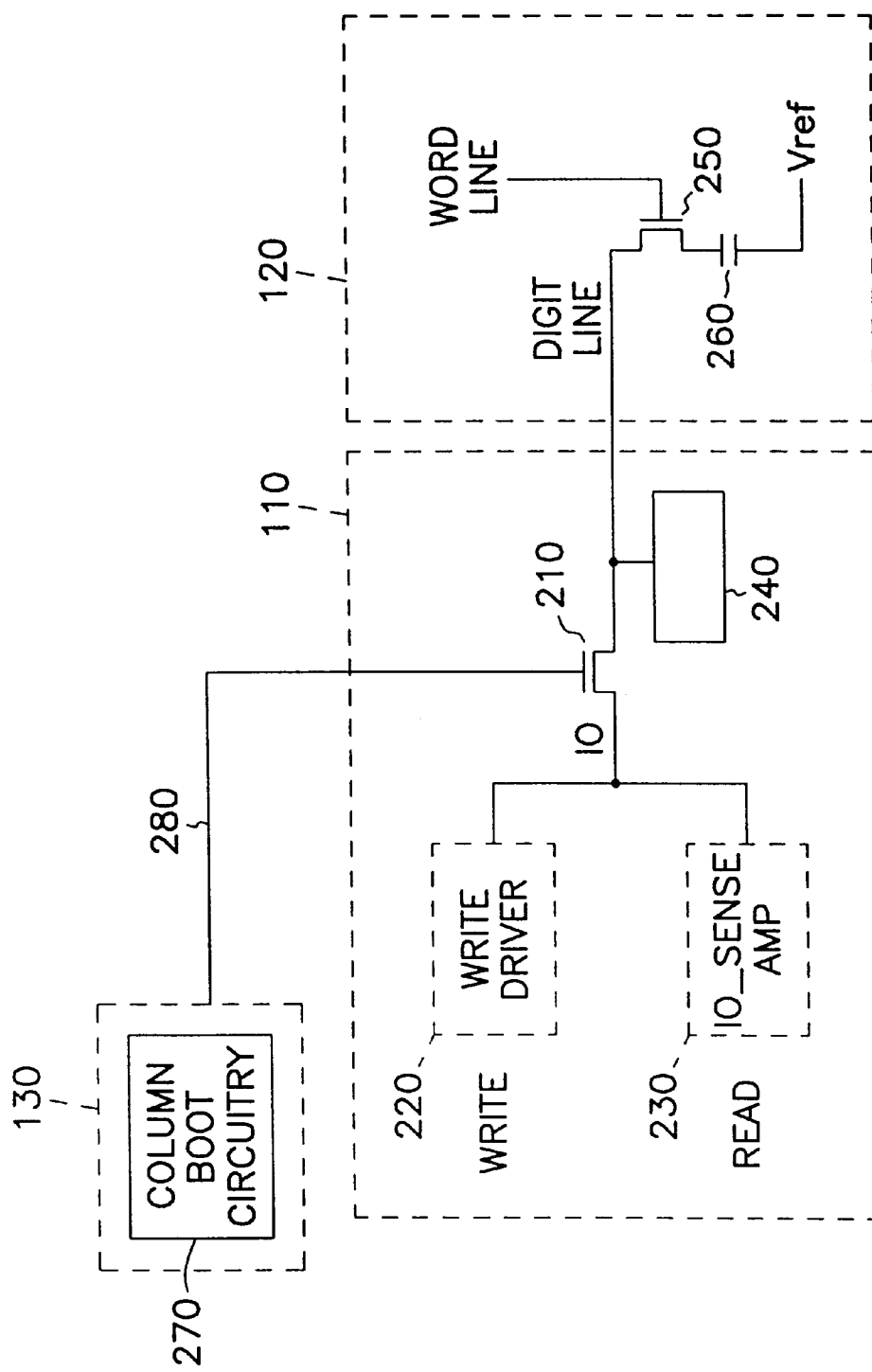
FIG. 3 is a block diagram of one embodiment of the present memory access system.

In FIG. 3, passgate 210 is an n-channel enhancement mode transistor device and column boot circuitry 270 provides a booted voltage (Vb) which exceeds the chip supply voltage (Vcc). For the purposes of this description, a booted voltage is any voltage exceeding the chip supply voltage (Vcc). The booted voltage, Vb, is applied to passgate 210 as a column select signal 280 so that the voltage passed through passgate 210 may exceed the previous Vcc-Vt value. The general equation describing the maximum voltage passed by the passgate 210 is approximately:

$$\text{maximum voltage passed} = Vb - Vt \qquad \text{Eqn. 1}$$

For example, for Vcc=5.0 volts, Vt=0.5 volts and Vb=5.4 volts, then the maximum voltage passed through the passgate 210 is 4.9 volts, for Vb applied as a column select signal voltage. If Vcc=5.0 volts, Vt=0.5 volts and Vb=5.8 volts, then the maximum voltage passed through the passgate 210 is 5.3 volts, or more correctly, 5.0 volts if the voltage across the passgate 210 does not exceed the power supply.

In one embodiment, the column select signal voltage is booted for a write operation, but not for a read operation. For example, during a write operation, Vb-Vt volts is transferred from write driver 220 to memory cell 260 via access device 250. This increases the switching speed of the write operation, since any boot to the column select signal both increases the voltage across the memory cell 250 and lowers the resistance of the passgate 210, decreasing the necessary charge time of memory cell 250.

A booted column select signal voltage is also beneficial during a read operation, since the booted column select signal voltage applied to passgate 210 increases the amount of voltage sensed by I/O sense amplifier 230. This effectively increases the noise margin for signals received from memory cell 260 and sense amplifier 240. The larger voltage passed by passgate 210 provides quicker reads from memory cell 260, since the received voltage is larger. It also provides improved noise margins, which in turn, may facilitate lower source voltages in future DRAM designs and noisier signal environments from multilayer or densely packed architectures.

Other combinations of selectively applying the booted column select signal for specific operations are possible without departing from the scope and spirit of the present invention.

Alternate embodiments employ a booted voltage produced elsewhere on the integrated circuit by switching passgate 210 using the booted voltage as a column select signal 280.

Those skilled in the art will readily recognize that other boot voltage sources may be used without departing from the scope and spirit of the present invention. Furthermore, any boot voltage above Vcc improves the amount of signal passed by passgate 210. However, boot voltages must have a voltage of at least the sum of the chip supply voltage, Vcc, and the threshold voltage, Vt, of the passgate in order to pass the entire voltage applied across the source and drain of passgate 210.

Although the embodiments described above relate to a DRAM device, the same principals apply to any memory device having column access. FIG. 4 shows a passgate 310 which separates memory cell access electronics 340 and memory device 320. Column select circuit 330 sends a column select signal on signal line 350 to passgate 310 to perform a read or write of memory device 320. Column select circuit 330 includes a booted voltage source to provide a booted column select signal to passgate 310. The maximum voltage passed by passgate 210 is described by Eqn. 1, above.

For example, a static memory device may experience the same improvements in switching and in noise margin as the DRAM embodiments described above. In this example, memory device 320 is an active memory cell used in a static memory device. Therefore, several embodiments exist which are not presented here and the present system may be applied to any memory device having columns of memory cells to access.

Alternate embodiments employing p-channel devices require a negative boot voltage, and those skilled in the art will readily recognize that such designs do not depart from the scope and spirit of the present invention.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. For example, particular voltages are described in this specification, however the voltages may be increased or decreased and circuit configurations may vary without departing from the scope and spirit of the present invention.

Those with skill in the electrical, computer, and telecommunications arts will readily appreciate that the present invention may be implemented in a very wide variety of embodiments. This application is intended to cover any adaptations or variations of the preferred embodiment discussed herein. Therefore, it is manifestly intended that this invention be limited only by the claims and the equivalents thereof.

What is claimed is:

1. A dynamic random access memory (DRAM) comprising:
    an array of memory cells;
    an access transistor connected to one of the memory cells and digit line, such that the access device has a drain connected to the digit line, and a source connected to the one memory cell;
    a word line coupled to a gate connection of the access transistor;
    an n-channel enhancement mode transistor having a source connection, drain connection and a gate connection, the source connection is coupled to the digit line, and the drain is selectively coupled to either a write driver circuit or an I/O sense amplifier circuit; and
    a voltage boot circuit-connected to the gate of the n-channel enhancement mode transistor, the voltage boot circuit provides a signal having a voltage that is equal to at least an external DRAM supply voltage plus a threshold voltage of the n-channel enhancement mode transistor.

2. A dynamic random access memory (DRAM) comprising:
    an array of memory cells arranged in rows and columns, each memory cell comprising a storage capacitor and an access transistor;
    an n-channel enhancement mode transistor having a first port coupled to at least one of the memory cells, and a second port connected to memory cell access read and write circuitry;
    a column select circuit connected to a gate connection of the n-channel enhancement mode transistor, the column select circuit comprises a column boot circuit for producing an internal booted column select signal having a voltage that is at least equal to an external DRAM supply voltage plus a threshold voltage of the n-channel enhancement mode transistor.

3. A static memory comprising:
    an array of memory cells;
    an access transistor connected to one of the memory cells and digit line, such that the access device has a drain connected to the digit line, and a source connected to the one memory cell;
    a word line coupled to a gate connection of the access transistor;
    an n-channel enhancement mode transistor having a source connection, drain connection and a gate connection, the source connection is coupled to the digit line, and the drain is selectively coupled to either a write driver circuit or an I/O sense amplifier circuit; and
    a voltage boot circuit connected to the gate of the n-channel enhancement mode transistor, the voltage boot circuit provides a signal having a voltage that is equal to at least an external voltage supply voltage plus a threshold voltage of the n-channel enhancement mode transistor.

4. A static memory comprising:
    an array of memory cells arranged in rows and columns, each memory cell comprising a storage capacitor and an access transistor;
    an n-channel enhancement mode transistor having a first port coupled to at least one of the memory cells, and a second port connected to memory cell access read and write circuitry;
    a column select circuit connected to a gate connection of the n-channel enhancement mode transistor, the column select circuit comprises a column boot circuit for producing an internal booted column select signal having a voltage that is at least equal to an external Voltage supply voltage plus a threshold voltage of the n-channel enhancement mode transistor.

5. An integrated circuit memory comprising:
    a node for receiving an external chip supply voltage;
    a plurality of memory cells for storing information; and
    a column select system comprising:
        an access device including a gate connected to a word line, a drain connected to a digit line, and a source connected to one of the memory cells;
        a passgate comprising an n-channel transistor device including a first port connected to the digit line, a second port connected to a write driver and an I/O sense amplifier, the write driver providing a voltage corresponding to the chip supply voltage, and a switchable gate; and
        a column driver connected to the switchable gate of the passgate, the column driver comprising column boot circuitry for producing an internal booted column select signal having a voltage that is at least the external chip supply voltage plus a threshold voltage of the passgate for enabling the passgate to transfer voltages approximately equal to the external chip supply voltage to the one memory cell.

6. The integrated circuit memory of claim 5 wherein the plurality of memory cells are dynamic memory cells.

7. An integrated circuit memory comprising:
    a node for receiving an external chip supply voltage;
    a plurality of memory cells for storing information, the plurality of memory cells configured in a plurality of columns; and
    a column select system comprising:
        a passgate comprising an n-channel transistor device including a first port coupled to at least one of the memory cells, a second port connected to memory cell access electronics having writing and reading voltages approximately equal to the chip supply voltage, and a switchable gate; and
        a column select circuit connected to the switchable gate of the passgate, the column select circuit comprising column boot circuitry for producing an internal booted column select signal having a voltage that is at least the external chip supply voltage plus a threshold voltage of the passgate for enabling the passgate to transfer voltages approximately equal to the external chip supply voltage between the cell access electronics and the one memory cell.

8. The integrated circuit memory of claim 7 wherein the plurality of memory cells are dynamic memory cells.

9. A method to access a column of memory device having a node to receive an external chip supply voltage, the method comprising:

generating an internal booted column select signal having a voltage that is at least the external chip supply voltage plus a threshold voltage of an n-channel transistor device acting as a passgate; and applying the internal booted column select signal to the passgate for activating the passgate to connect a memory cell in a memory array to memory cell access electronics to transfer voltages between the memory cell access electronics and the memory cell which are approximately equal to the external chip supply voltage.

10. The method of claim 9 wherein the memory cell is a dynamic memory cell.

11. A method of reading a memory cell comprising:

accessing the memory cell to couple a data from the memory cell to a digit line;

generating an internal booted column select signal having a voltage that has a potential that is at least an external chip supply voltage plus a threshold voltage of an n-channel transistor; and coupling the internal booted column select signal to activate an n-channel transistor having a first node coupled to the digit line, and a second node coupled to data sense amplifier circuitry.

12. The method of claim 11 wherein accessing the memory cell comprises activating an access transistor coupled between the memory cell and the digit line.

13. The method of claim 11 wherein the memory cell is a dynamic memory cell.

14. A method of writing data to a memory cell comprising:

accessing the memory cell to couple the memory cell to a digit line;

generating an internal booted column select signal having a voltage that has a potential that is at least an external chip supply voltage plus a threshold voltage of an n-channel transistor;

coupling the internal booted column select signal to activate an n-channel transistor having a first node coupled to the digit line, and a second node coupled to write driver circuitry; and providing a data signal from the write driver circuit.

15. The method of claim 14 wherein accessing the memory cell comprises activating an access transistor coupled between the memory cell and the digit line.

16. The method of claim 14 wherein the memory cell is a dynamic memory cell.

* * * * *